United States Patent
Kasama

(10) Patent No.: US 12,489,003 B2
(45) Date of Patent: Dec. 2, 2025

(54) WIRE BONDING SYSTEM, INSPECTION DEVICE, WIRE BONDING METHOD, AND RECORDING MEDIUM

(71) Applicant: Yamaha Robotics Co., Ltd., Tokyo (JP)

(72) Inventor: Hiroyuki Kasama, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 22 days.

(21) Appl. No.: 18/559,342

(22) PCT Filed: May 25, 2021

(86) PCT No.: PCT/JP2021/019712
§ 371 (c)(1),
(2) Date: Nov. 7, 2023

(87) PCT Pub. No.: WO2022/249262
PCT Pub. Date: Dec. 1, 2022

(65) Prior Publication Data
US 2024/0242984 A1    Jul. 18, 2024

(51) Int. Cl.
*B23K 20/00* (2006.01)
*B23K 31/12* (2006.01)
(Continued)

(52) U.S. Cl.
CPC ...... *H01L 21/67138* (2013.01); *B23K 20/007* (2013.01); *B23K 31/125* (2013.01); *H01L 21/603* (2021.08); *H01L 22/12* (2013.01)

(58) Field of Classification Search
CPC . H01L 21/67138; H01L 21/603; H01L 22/12; H01L 2224/78; H01L 21/60;
(Continued)

(56) References Cited

U.S. PATENT DOCUMENTS 5,566,876 A    10/1996 Nishimaki et al.
7,842,897 B2    11/2010 Miyahara et al.
(Continued)

FOREIGN PATENT DOCUMENTS

CN    104241154 A  * 12/2014  ............. B23K 1/012
CN    114420580 A  *  4/2022
(Continued)

OTHER PUBLICATIONS

"Office Action of Korea Counterpart Application", issued on Jul. 22, 2024, with English translation thereof, p. 1-p. 20.
(Continued)

*Primary Examiner* — Kiley S Stoner
(74) *Attorney, Agent, or Firm* — JCIPRNET

(57) ABSTRACT

A wire bonding system according to the present invention comprises: an acquisition unit that acquires information pertaining to the diameter of a pressure-bonded ball where a wire is pressure-bonded to an electronic component by wire bonding; a first storage unit that stores the information pertaining to the pressure-bonded ball diameter which has been acquired by the acquisition unit; and an inspection unit that inspects the quality of wire bonding on the basis of the information pertaining to the pressure-bonded ball diameter which has been read from the first storage unit. With the wire bonding system, it is possible to enhance convenience in a method for checking the quality of wire bonding.

8 Claims, 8 Drawing Sheets

(51) Int. Cl.
*H01L 21/603* (2006.01)
*H01L 21/66* (2006.01)
*H01L 21/67* (2006.01)

(58) Field of Classification Search
CPC ... H01L 24/78; H01L 24/85; H01L 2224/789; H01L 2224/85201; B23K 20/004; B23K 20/005; B23K 20/007; B23K 31/125
USPC .............. 228/180.5, 4.5, 102–105, 8–12
See application file for complete search history.

(56) References Cited

U.S. PATENT DOCUMENTS

| | | | |
|---|---|---|---|
| 10,607,959 B2 | 3/2020 | Sasakura et al. | |
| 2006/0079008 A1* | 4/2006 | Nishimaki | B23K 20/007 438/11 |
| 2014/0054781 A1* | 2/2014 | Higgins, III | H01L 24/48 257/762 |
| 2017/0125311 A1* | 5/2017 | Shah | H01L 24/78 |
| 2019/0027463 A1* | 1/2019 | Shah | H01L 25/0657 |

FOREIGN PATENT DOCUMENTS

| | | | | | |
|---|---|---|---|---|---|
| JP | H05335389 A | * | 12/1993 | | |
| JP | 07037923 A | * | 2/1995 | ............ | H01L 24/48 |
| JP | 07037924 A | * | 2/1995 | ............ | H01L 24/48 |
| JP | 07037925 A | * | 2/1995 | ............ | H01L 24/48 |
| JP | H0737926 | | 2/1995 | | |
| JP | H07321132 | | 12/1995 | | |
| JP | 08031863 A | * | 2/1996 | ............ | H01L 24/48 |
| JP | H0864629 | | 3/1996 | | |
| JP | H09189531 | | 7/1997 | | |
| JP | H10199915 | | 7/1998 | | |
| JP | H10242219 A | * | 9/1998 | | |
| JP | 11063928 A | * | 3/1999 | ............ | H01L 24/78 |
| JP | 11297747 A | * | 10/1999 | ............ | H01L 24/05 |
| JP | 2001118880 | | 4/2001 | | |
| JP | 2001118880 A | * | 4/2001 | ............ | H01L 24/78 |
| JP | 2002026085 A | * | 1/2002 | ............ | H01L 24/49 |
| JP | 2004186591 | | 7/2004 | | |
| JP | 2006186087 | | 7/2006 | | |
| JP | 2006303117 A | * | 11/2006 | ............ | H01L 24/78 |
| JP | 4247299 B1 | * | 4/2009 | ............ | B23K 20/007 |
| JP | 4264458 B1 | * | 5/2009 | ............ | B23K 20/007 |
| JP | 2017216314 A | * | 12/2017 | | |
| JP | 6487108 B1 | * | 3/2019 | ............... | C22C 9/06 |
| JP | 2020119988 | | 8/2020 | | |
| JP | 6869920 B2 | * | 5/2021 | ......... | H01L 23/4952 |
| KR | 930011144 A | * | 3/1996 | | |
| KR | 2011108603 A | * | 10/2011 | ............ | H01L 24/78 |
| KR | 20110108603 A | * | 10/2011 | | |
| KR | 20110118928 A | * | 11/2011 | | |
| WO | 2015122411 | | 8/2015 | | |
| WO | WO-2018110417 A1 | * | 6/2018 | ............ | H01L 24/00 |
| WO | WO-2020183748 A1 | * | 9/2020 | ......... | H01L 23/4952 |
| WO | WO-2020217970 A1 | * | 10/2020 | ............ | G06T 7/001 |
| WO | WO-2022249262 A1 | * | 12/2022 | ............ | H01L 21/60 |

OTHER PUBLICATIONS

"International Search Report (Form PCT/ISA/210) of PCT/JP2021/019712", mailed on Aug. 10, 2021, with English translation thereof, pp. 1-6.

"Office Action of Taiwan Counterpart Application", issued on Jul. 10, 2023, with partial English translation thereof, pp. 1-21.

* cited by examiner

WIRE BONDING SYSTEM, INSPECTION DEVICE, WIRE BONDING METHOD, AND RECORDING MEDIUM

CROSS-REFERENCE TO RELATED APPLICATION

This application is a 371 application of the International PCT application serial no. PCT/JP2021/019712, filed on May 25, 2021. The entirety of the above-mentioned patent application is hereby incorporated by reference herein and made a part of this specification.

TECHNICAL FIELD

The present invention relates to a wire bonding system, an inspection device, a wire bonding method, and a program.

RELATED ART

Conventionally, there is known a wire bonding apparatus, which wires a wire between an electronic component mounted on a substrate and a lead frame by bonding one end of the wire to the electronic component and bonding the other end of the wire to an electrode of the lead frame (see, for example, Patent Literature 1).

CITATION LIST

Patent Literature

[Patent Literature 1] Japanese Patent Application Laid-Open No. 2020-119988

SUMMARY OF INVENTION

Technical Problem

However, for the conventional technology, there is still room for improvement in the method for checking the quality of wire bonding.

The present invention has been made to solve such problems, and provides a wire bonding system, an inspection device, a wire bonding method, and a program capable of improving the convenience in the method for checking the quality of wire bonding.

Solution to Problem

A wire bonding system according to one aspect of the present invention includes: an acquisition unit that acquires information pertaining to a diameter of a pressure-bonded ball where a wire is pressure-bonded to an electronic component by wire bonding; a first storage unit that stores the information pertaining to the diameter of the pressure-bonded ball acquired by the acquisition unit; and an inspection unit that inspects quality of wire bonding based on the information pertaining to the diameter of the pressure-bonded ball read from the first storage unit.

An inspection device according to one aspect of the present invention includes: an inspection unit that reads information pertaining to a diameter of a pressure-bonded ball where a wire is pressure-bonded to an electronic component by wire bonding from a first storage unit, and inspects quality of the wire bonding based on the read information pertaining to the diameter of the pressure-bonded ball.

Further, a wire bonding method according to one aspect of the present invention includes: a step of acquiring information pertaining to a diameter of a pressure-bonded ball where a wire is pressure-bonded to an electronic component by wire bonding; a step of storing the acquired information pertaining to the diameter of the pressure-bonded ball in a first storage unit; and a step of inspecting quality of the wire bonding based on the information pertaining to the diameter of the pressure-bonded ball read from the first storage unit.

Further, a program according to one aspect of the present invention causes one or more computers to execute: a process of acquiring information pertaining to a diameter of a pressure-bonded ball where a wire is pressure-bonded to an electronic component by wire bonding; a process of storing the acquired information pertaining to the diameter of the pressure-bonded ball in a first storage unit; and a process of inspecting quality of the wire bonding based on the information pertaining to the diameter of the pressure-bonded ball read from the first storage unit.

Effects of Invention

According to the present invention, it is possible to improve the convenience in the method for checking the quality of wire bonding.

DESCRIPTION OF EMBODIMENTS

First Embodiment

A wire bonding apparatus according to the first embodiment will be described hereinafter with reference to the drawings.

Figure 1:
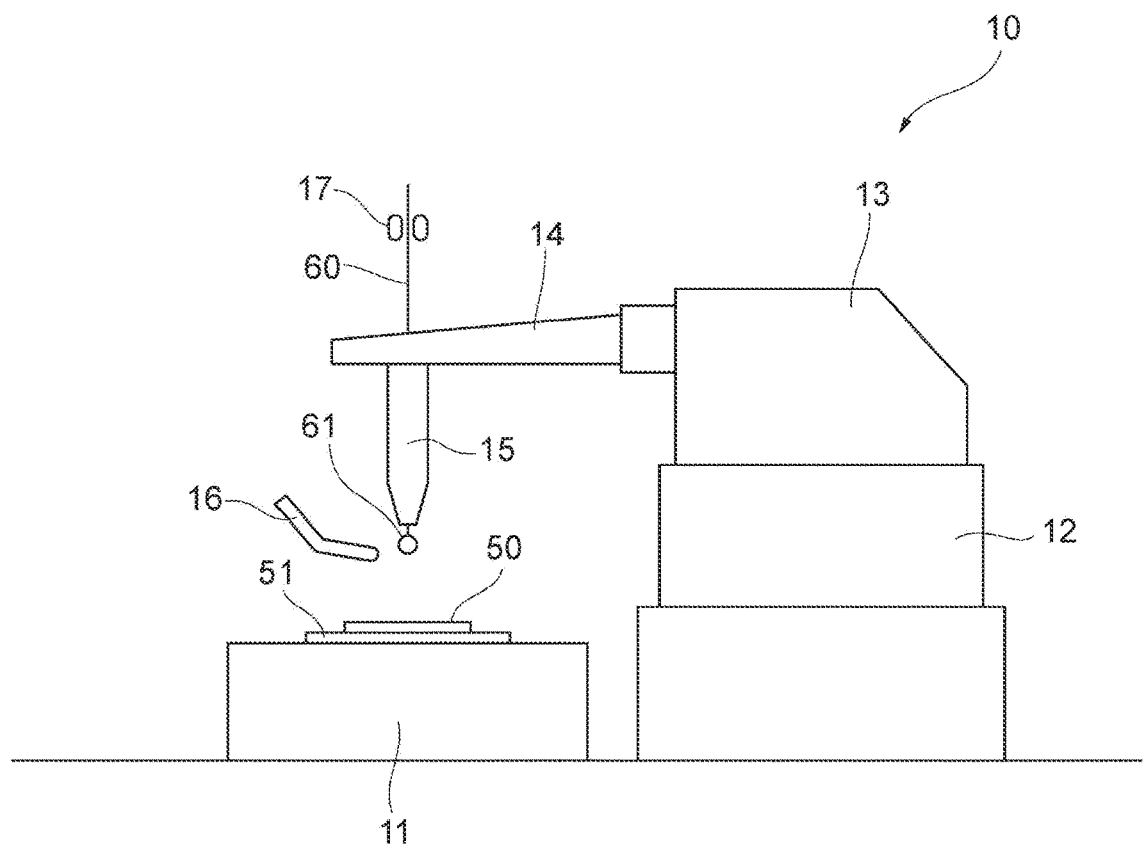
FIG. 1 is a diagram showing the configuration of the wire bonding apparatus according to the first embodiment.

As shown in FIG. 1, the wire bonding apparatus 10 includes, for example, a stage 11, an XY table 12, a bonding head 13, a bonding arm 14, a capillary 15 (an example of a bonding tool), a discharge electrode 16, and a clamper 17.

A substrate 51 on which a semiconductor chip 50 is mounted is placed on the stage 11. The stage 11 has a heater (not shown) built therein for heating a lead frame (not shown) formed on the substrate 51. The heater heats the lead frame during wire bonding.

The XY table 12 is connected to the bonding head 13. The bonding head 13 is connected to the bonding arm 14 via an elevating mechanism (not shown). The bonding arm 14 is an arm that protrudes in the horizontal direction from the bonding head 13. The capillary 15 is connected to the tip of the bonding arm 14. The capillary 15 is configured to be able to move relative to the semiconductor chip 50 placed on the stage 11 in the horizontal direction and the vertical direction as the bonding head 13 moves in the horizontal direction by the XY table 12 and moves in the vertical direction by the elevating mechanism.

The bonding arm 14 has a built-in ultrasonic vibrator. The ultrasonic vibrator applies ultrasonic vibration to the capillary 15 connected to the tip of the bonding arm 14 when a voltage is applied during wire bonding.

The capillary 15 faces the stage 11 in the vertical direction and has a through hole penetrating the stage 11 in the vertical direction. A wire 60 such as a gold wire is inserted through the through hole of the capillary 15. The discharge electrode 16 is disposed in the vicinity of the capillary 15.

When a voltage is applied to the discharge electrode 16, a discharge is generated between the discharge electrode 16 and the tip of the wire 60, and the tip portion of the wire 60 is melted to form a ball portion 61.

The clamper 17 is provided above the capillary 15 and is configured to be able to clamp the wire 60 inserted through the through hole of the capillary 15.

Then, the wire bonding apparatus 10 presses the ball portion 61 formed at the first end of the wire 60 against the semiconductor chip 50 as the voltage is applied to the discharge electrode 16. Then, the wire bonding apparatus 10 bonds the first end of the wire 60 to the semiconductor chip 50 and then moves the capillary 15 to bend the wire 60, so that a part of the wire 60 faces the terminal of the substrate 51 in the vertical direction. Subsequently, the wire bonding apparatus 10 presses the part of the wire 60 against the terminal of the substrate 51 as the voltage is applied to the discharge electrode 16. Then, the wire bonding apparatus 10 bonds the part of the wire 60 to the terminal of the substrate 51 and then moves the capillary 15 upward with the wire 60 clamped by the clamper 17 to cut the wire 60.

Next, the control configuration of the wire bonding apparatus 10 will be described.

Figure 2:
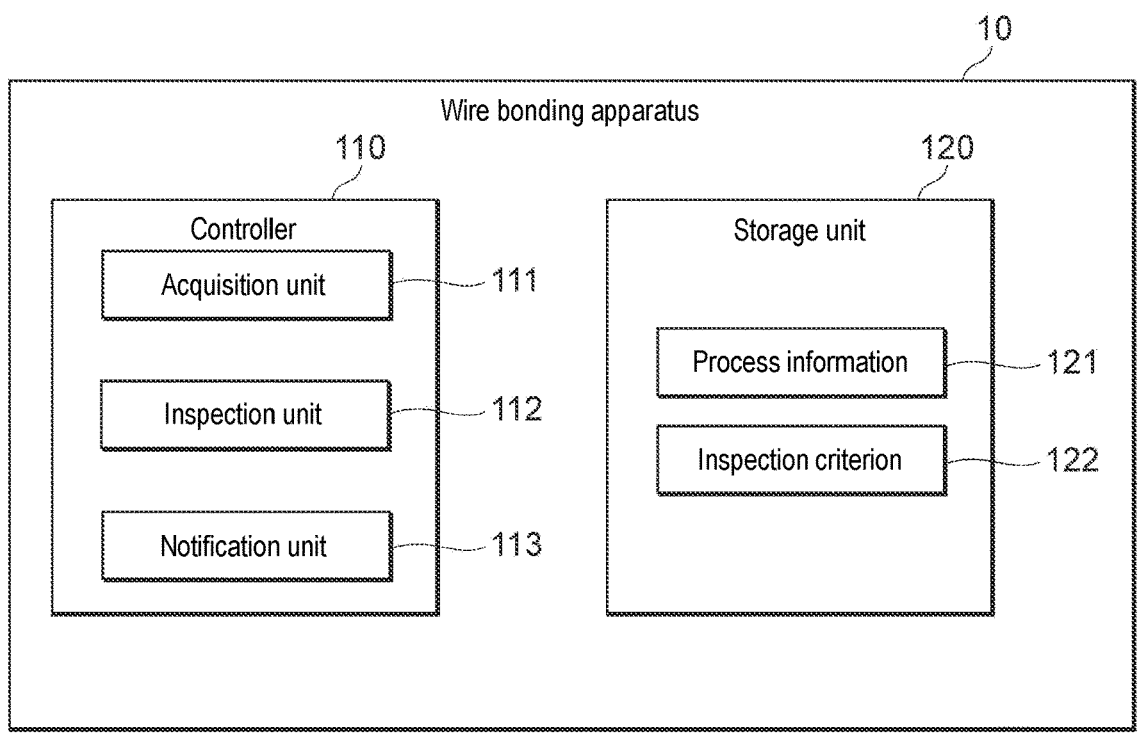
FIG. 2 is a diagram showing the control configuration of the wire bonding apparatus according to the first embodiment.

As shown in FIG. 2, the wire bonding apparatus 10 includes, for example, a controller 110 and a storage unit 120.

The controller 110 is realized by, for example, a hardware processor such as a central processing unit (CPU) executing a program (software). In addition, some or all of the components may be realized by hardware (a circuit unit including circuitry) such as a large scale integration (LSI), an application specific integrated circuit (ASIC), a field-programmable gate array (FPGA), a graphics processing unit (GPU), and the like, or may be realized by the cooperation of software and hardware. The program may be stored in advance in a storage device such as an HDD or a flash memory of the wire bonding apparatus 10, or may be stored in a removable storage medium such as a DVD or a CD-ROM, and may be installed in the HDD or flash memory of the wire bonding apparatus 10 by mounting the storage medium to a drive device.

The storage unit 120 is a non-volatile storage medium, and is configured by, for example, a hard disk drive (HDD). The storage unit 120 stores various parameter values, functions, look-up tables, and the like used for control and calculation, in addition to a program for executing control and processing of the wire bonding apparatus 10. Examples of parameter values used for control and calculation include process information 121 and an inspection criterion 122.

The process information 121 is information measured during wire bonding. The process information 121 includes, for example, information pertaining to the diameter of the pressure-bonded ball where the wire 60 is pressure-bonded to the terminal of the semiconductor chip 50 or the terminal of the substrate 51 by wire bonding. The information pertaining to the pressure-bonded ball diameter is information indicating the quality of wire bonding. The information pertaining to the pressure-bonded ball diameter includes, for example, a load, a US current, a spark voltage, a spark current, a pressing amount of the ball portion 61, and observation information. The load is information pertaining to the load acting from the capillary 15 to the terminal of the semiconductor chip 50 or the terminal of the substrate 51 during wire bonding. The US current is information pertaining to the current that flows through the ultrasonic vibrator during wire bonding. The spark voltage is information pertaining to the voltage applied to the discharge electrode 16 during wire bonding. The spark current is information pertaining to the current that flows through the discharge electrode 16 during wire bonding. The pressing amount of the ball portion 61 is information pertaining to the amount of pressing the ball portion 61 at the tip of the wire 60 against the terminal of the semiconductor chip 50 or the terminal of the substrate 51 during wire bonding. The observation information includes image information of the pressure-bonded portion of the wire 60 with respect to the terminal of the semiconductor chip 50 or the terminal of the substrate 51.

The inspection criterion 122 is information used when inspecting the quality of wire bonding, and is, for example, a threshold value for the information pertaining to the pressure-bonded ball diameter.

The controller 110 includes an acquisition unit 111, an inspection unit 112, and a notification unit 113, for example.

The acquisition unit 111 acquires the information pertaining to the diameter of the pressure-bonded ball where the wire 60 is pressure-bonded to the terminal of the semiconductor chip 50 or the terminal of the substrate 51 by wire bonding. For example, when the acquisition unit 111 acquires the information pertaining to the pressure-bonded ball diameter during wire bonding, the acquisition unit 111 stores the acquired information as the process information 121 in the storage unit 120.

The inspection unit 112 inspects the quality of wire bonding based on the information pertaining to the pressure-bonded ball diameter read from the storage unit 120. The inspection unit 112 inspects the quality of wire bonding by referring to the inspection criterion 122 stored in the storage unit 120 based on the information pertaining to the pressure-bonded ball diameter acquired by the acquisition unit 111, for example. The inspection unit 112 inspects the quality of wire bonding by comparing the information pertaining to the pressure-bonded ball diameter acquired by the acquisition unit 111 with the threshold value stored as the inspection criterion 122 in the storage unit 120, for example.

The notification unit 113 notifies the inspection result of the quality of wire bonding when the inspection result of the quality of wire bonding from the inspection unit 112 does not satisfy a predetermined condition. For example, when the inspection unit 112 outputs an inspection result indicating that the quality of wire bonding is poor, the notification unit 113 notifies the inspection result of the quality of wire bonding from the inspection unit 112.

Next, a notification process for the inspection result of the quality of wire bonding in the wire bonding apparatus 10 according to the first embodiment will be described with reference to the flowchart shown in FIG. 3. The flowchart shown in FIG. 3 is started, for example, when the user requests to check the quality of wire bonding.

Figure 3:
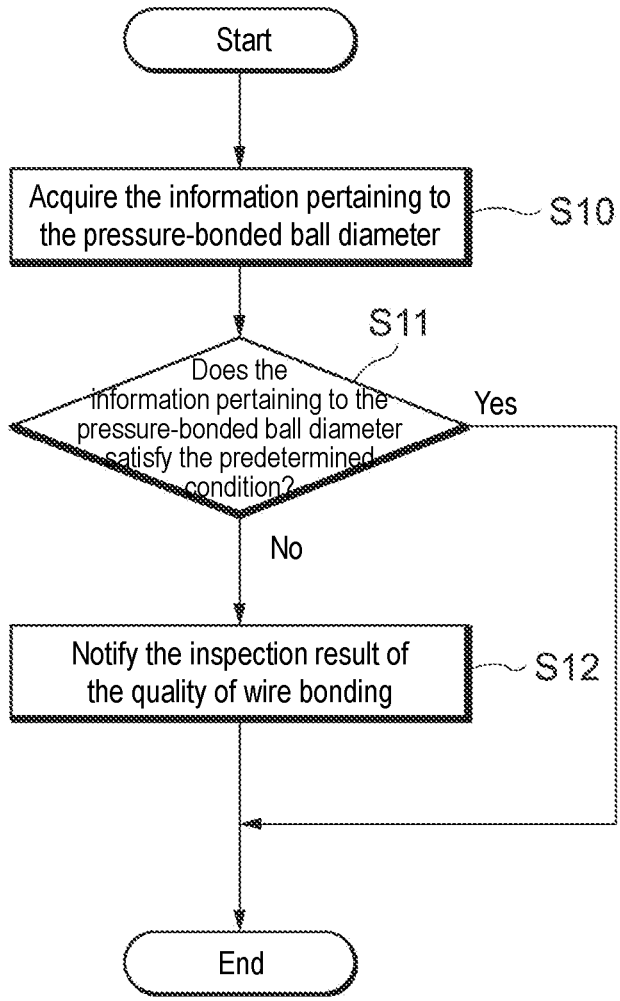
FIG. 3 is a flowchart showing an example of the notification process of the inspection result of the quality of wire bonding in the wire bonding apparatus according to the first embodiment.

As shown in FIG. 3, the wire bonding apparatus 10 acquires the information pertaining to the pressure-bonded ball diameter stored as the process information 121 in the storage unit 120 (step S10).

Next, the wire bonding apparatus 10 determines whether the information pertaining to the pressure-bonded ball diameter acquired in step S10 satisfies the predetermined condition (step S11). When the wire bonding apparatus 10 determines that the information pertaining to the pressure-bonded ball diameter satisfies the predetermined condition (step S11=YES), the process of the flowchart shown in FIG. 3 is terminated without notifying the inspection result of the quality of wire bonding. On the other hand, when the wire bonding apparatus 10 determines that the information pertaining to the pressure-bonded ball diameter does not satisfy the predetermined condition (step S11=NO), the user is notified of the inspection result of the quality of wire bonding (step S12), and the process of the flowchart shown in FIG. 3 is terminated.

Second Embodiment

In the second and subsequent embodiments, descriptions for matters that have been specified in the first embodiment will be omitted, and only the differences will be described. Particularly, similar actions and effects brought by similar configurations will not be mentioned sequentially for each embodiment.

Figure 4:
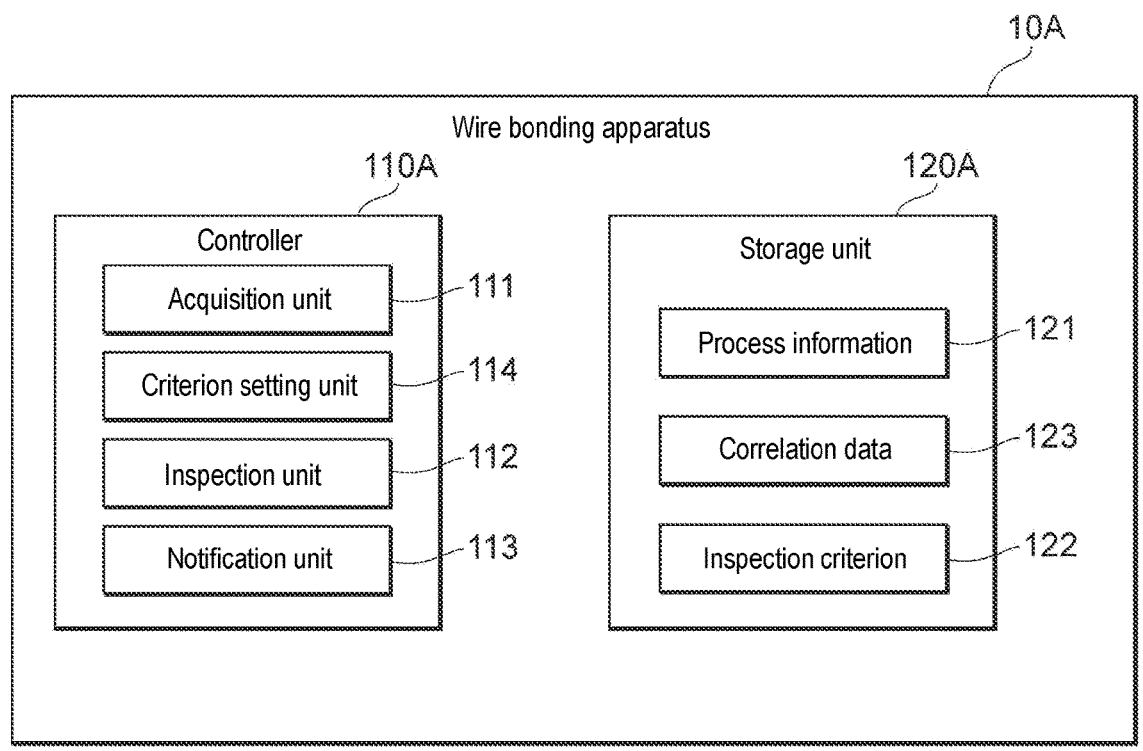
FIG. 4 is a diagram showing the control configuration of the wire bonding apparatus according to the second embodiment.

As shown in FIG. 4, the controller 110A of the wire bonding apparatus 10A according to the second embodiment further includes a criterion setting unit 114 in addition to the acquisition unit 111, the inspection unit 112, and the notification unit 113, for example.

When the information amount of the information pertaining to the pressure-bonded ball diameter stored as the process information 121 in the storage unit 120A reaches or exceeds a predetermined amount, the criterion setting unit 114 sets an inspection criterion 122 for the information pertaining to the pressure-bonded ball diameter. For example, the criterion setting unit 114 reads correlation data 123 indicating the correlation between the pressing amount of the ball portion 61 and the pressure-bonded ball diameter from the storage unit 120A, and refers to the read correlation data 123 to set a threshold value for the pressing amount of the ball portion 61 as the inspection criterion 122.

For example, the inspection unit 112 inspects the quality of wire bonding by comparing the pressing amount of the ball portion 61 acquired by the acquisition unit 111 with the threshold value set as the inspection criterion 122 by the criterion setting unit 114.

Figure 5:
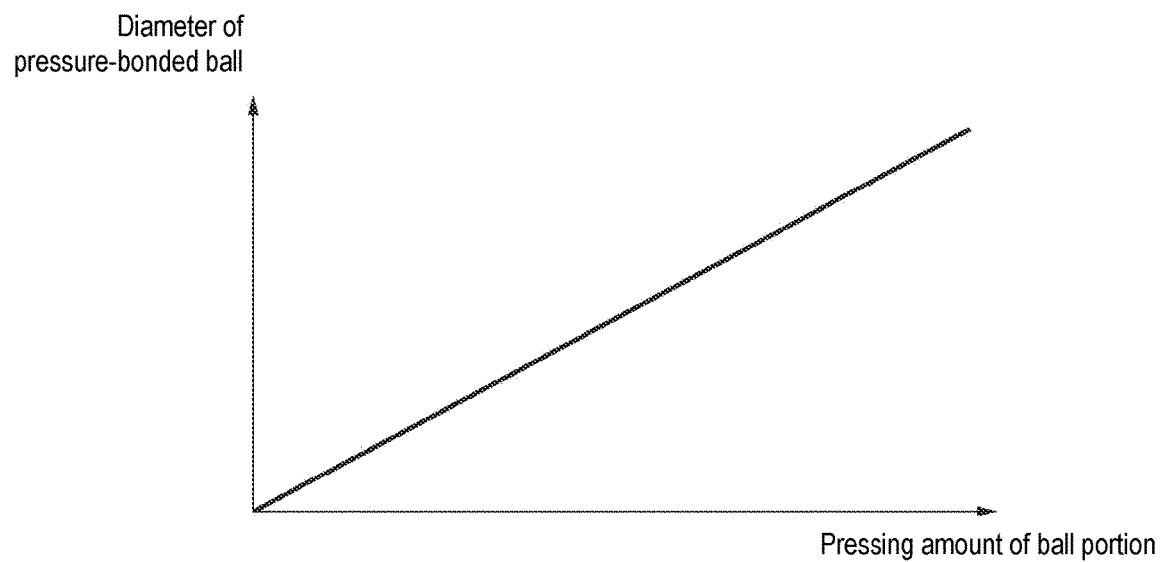
FIG. 5 is a diagram showing an example of the correlation data showing the correlation between the pressing amount of the ball portion and the pressure-bonded ball diameter.

FIG. 5 shows an example of the correlation data 123 indicating the correlation between the pressing amount of the ball portion 61 and the pressure-bonded ball diameter. As shown in the figure, there is a positive correlation between the pressing amount of the ball portion 61 and the pressure-bonded ball diameter, and the pressure-bonded ball diameter increases as the pressing amount of the ball portion 61 increases.

For example, the criterion setting unit 114 specifies the pressing amount of the ball portion 61 corresponding to standard data by referring to the correlation data 123 read from the storage unit 120A, based on preset standard data of the pressure-bonded ball diameter, and sets a numerical range including the specified pressing amount of the ball portion 61 as the inspection criterion 122.

For example, the inspection unit 112 inspects the quality of wire bonding based on whether the pressing amount of the ball portion 61 acquired by the acquisition unit 111 is within the numerical range set as the inspection criterion 122.

Next, a setting process of the inspection criterion 122 in the wire bonding apparatus 10A according to the second embodiment will be described with reference to the flowchart shown in FIG. 6. The flowchart shown in FIG. 6 is started, for example, each time the process information 121 is acquired.

Figure 6:
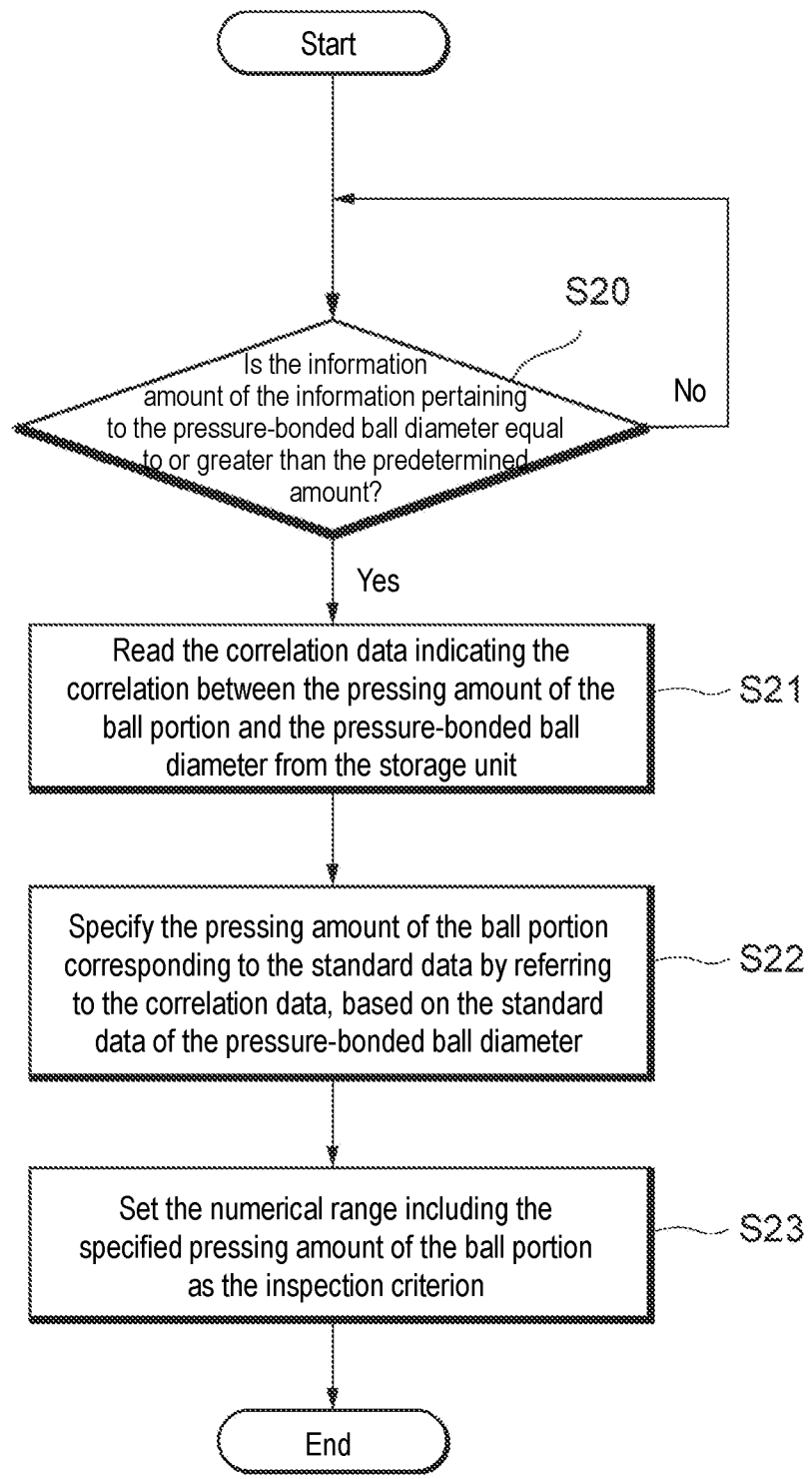
FIG. 6 is a flowchart showing an example of the setting process of the inspection criterion in the wire bonding apparatus according to the second embodiment.

As shown in FIG. 6, the wire bonding apparatus 10A determines whether the information amount of the information pertaining to the pressure-bonded ball diameter is equal to or greater than the predetermined amount (step S20). When the information amount of the information pertaining to the pressure-bonded ball diameter is equal to or greater than the predetermined amount (step S20=YES), the wire bonding apparatus 10A reads the correlation data 123 indicating the correlation between the pressing amount of the ball portion 61 and the pressure-bonded ball diameter from the storage unit 120A (step S21). Next, the wire bonding apparatus 10A specifies the pressing amount of the ball portion 61 corresponding to the standard data by referring to the correlation data 123, based on the standard data of the pressure-bonded ball diameter (step S22). Next, the wire bonding apparatus 10A sets the numerical range including the pressing amount of the ball portion 61 specified in the previous step S22 as the inspection criterion 122 (step S23), and the flowchart shown in FIG. 6 is terminated.

Figure 7:
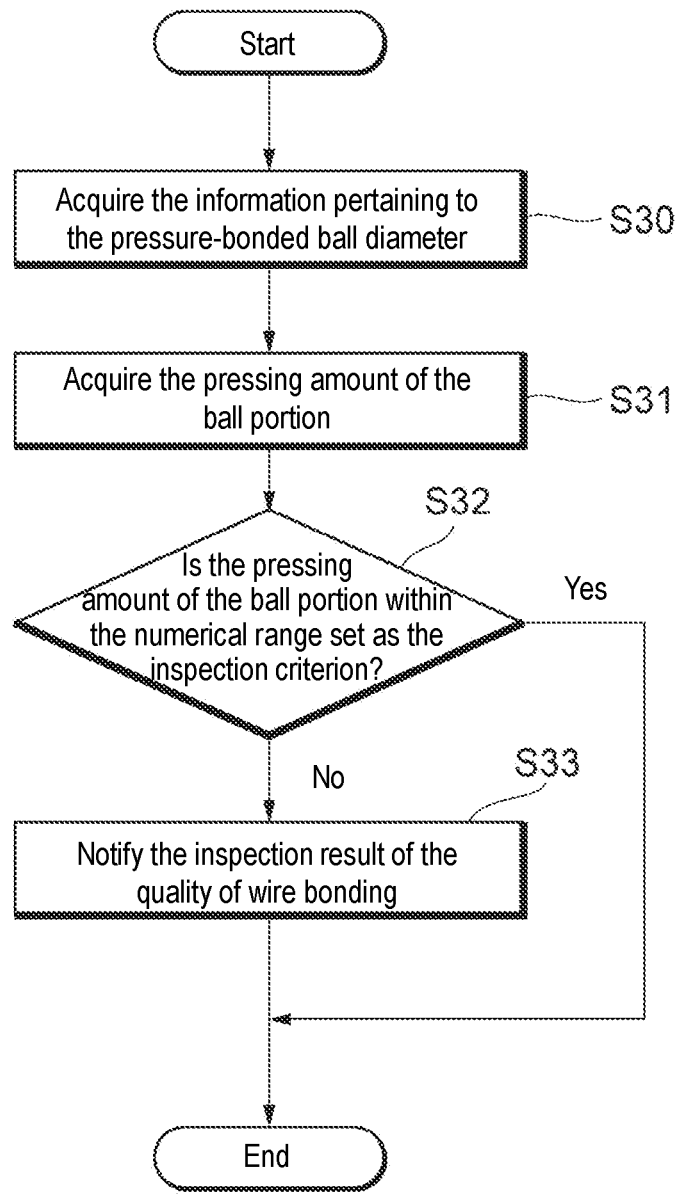
FIG. 7 is a flowchart showing an example of the notification process of the inspection result of the quality of wire bonding in the wire bonding apparatus according to the second embodiment.

As shown in FIG. 7, the wire bonding apparatus 10A acquires the information pertaining to the pressure-bonded ball diameter stored as the process information 121 in the storage unit 120A (step S30). Next, the wire bonding apparatus 10A acquires the pressing amount of the ball portion 61 stored as the process information 121 in the storage unit 120A (step S31). Next, the wire bonding apparatus 10A determines whether the pressing amount of the ball portion 61 acquired in the previous step S31 is within the numerical range set as the inspection criterion 122 (step S32). When the wire bonding apparatus 10A determines that the pressing amount of the ball portion 61 is not within the numerical range set as the inspection criterion 122 (step S32=NO), the user is notified of the inspection result of the quality of wire bonding (step S33), and the flowchart shown in FIG. 7 is terminated. On the other hand, when the wire bonding apparatus 10A determines that the pressing amount of the ball portion 61 is within the numerical range set as the inspection criterion 122 (step S32=YES), the flowchart shown in FIG. 7 is terminated without notifying the inspection result of the quality of wire bonding.

Third Embodiment

The notification unit 113 of the wire bonding apparatus 10 according to the third embodiment notifies the inspection result of the quality of wire bonding from the inspection unit 112 in association with information pertaining to the position of wire bonding at the terminal of the semiconductor chip 50 or the terminal of the substrate 51.

Figure 8:
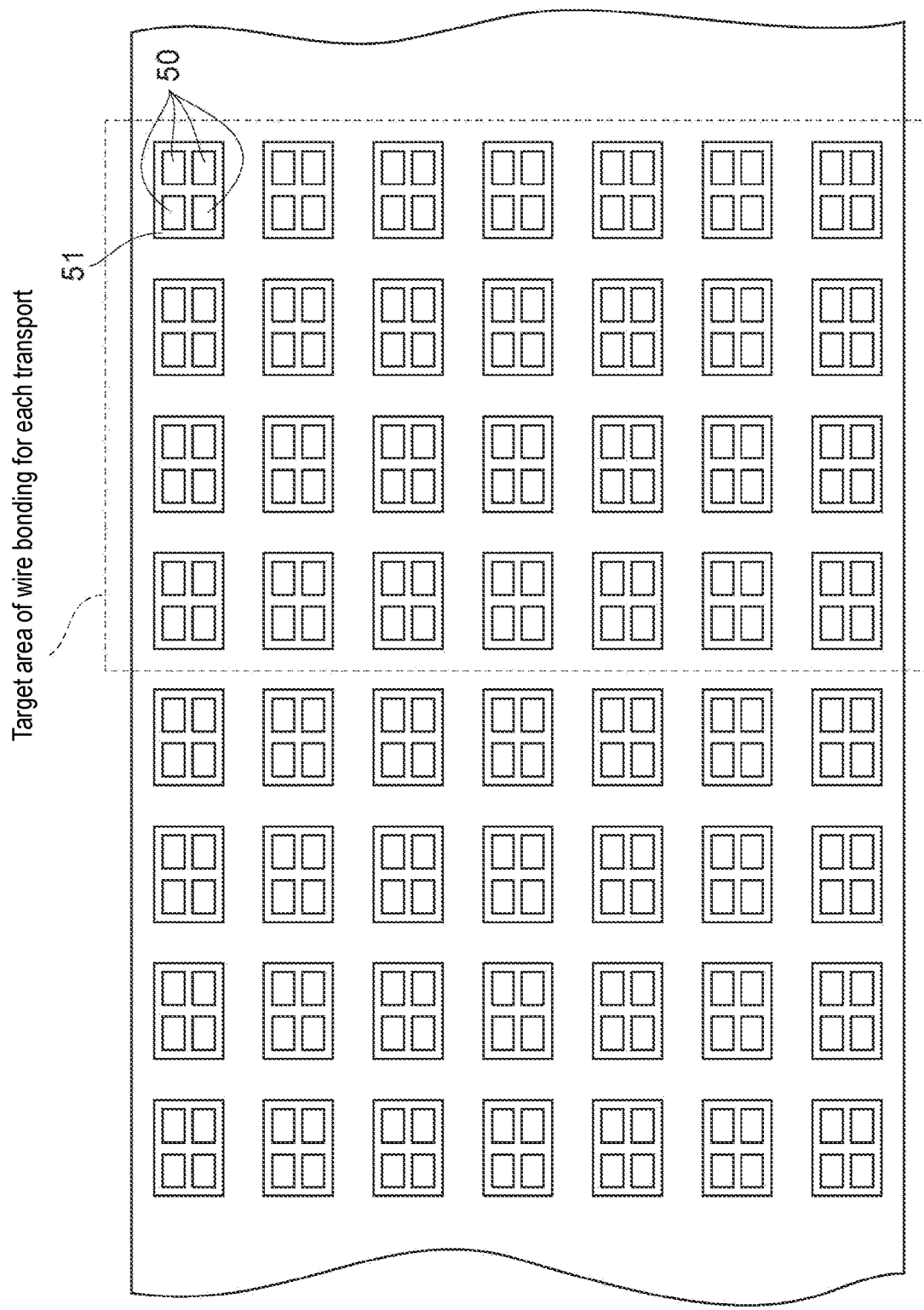
FIG. 8 is a diagram for illustrating an example of the target area of wire bonding for each transport.

The wire bonding apparatus 10 according to the third embodiment executes wire bonding on the substrate 51 while intermittently transporting the substrate 51. In the example shown in FIG. 8, when the transport direction of the substrate 51 is defined as the first direction and a direction intersecting the transport direction of the substrate 51 is defined as the second direction, a group of substrates 51 arranged in parallel in the first direction and the second direction is a target area for wire bonding for each transport.

Figure 9:
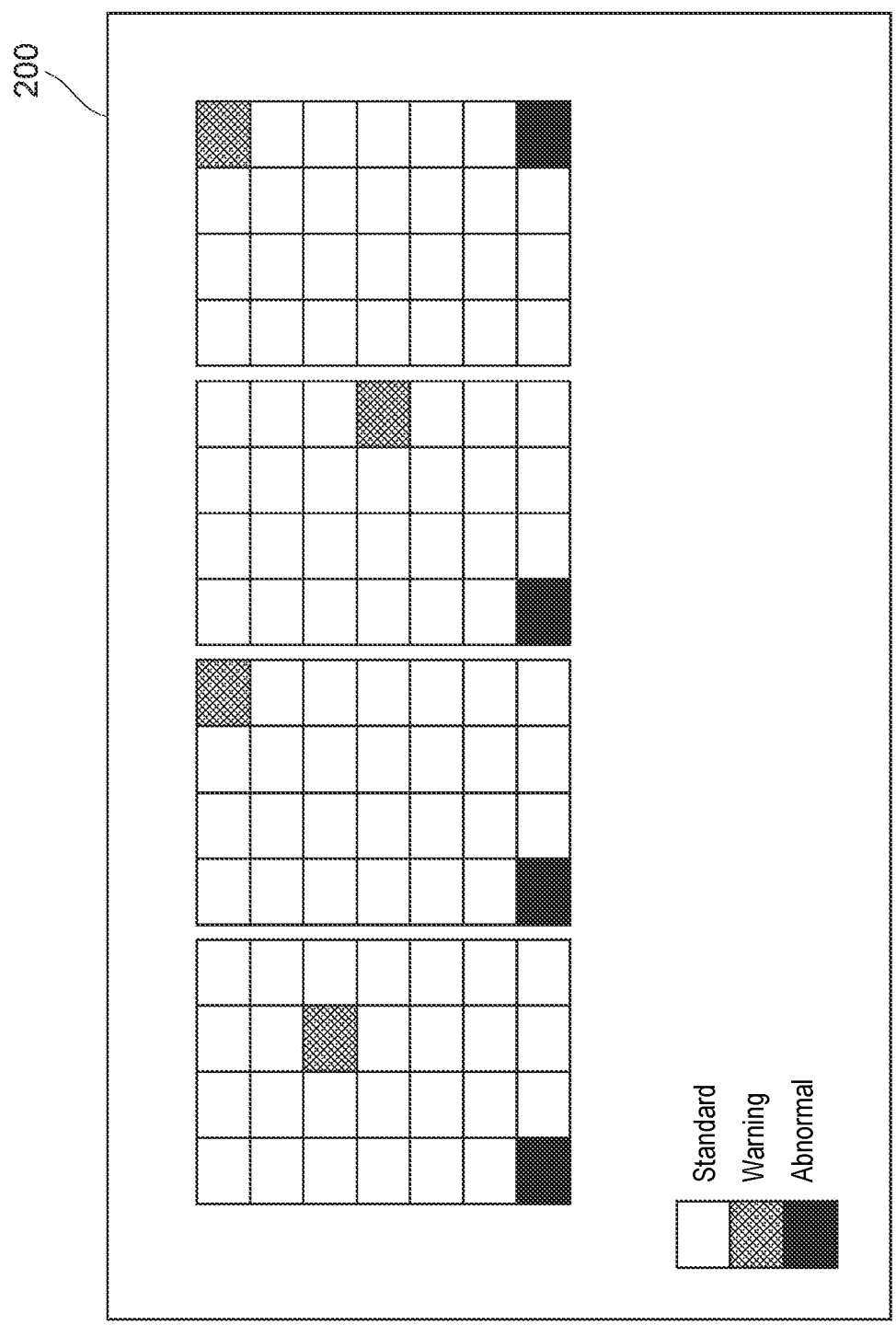
FIG. 9 is a diagram showing an example of display of the inspection result of the quality of wire bonding.

FIG. 9 is a diagram showing an example of display of the inspection result of the quality of wire bonding in the wire bonding apparatus 10 according to the third embodiment. In the example shown in the figure, the notification unit 113 of the wire bonding apparatus 10 displays the inspection result of the quality of wire bonding performed on each semiconductor chip 50 on the display unit 200 in association with the position of the substrate 51 on which each semiconductor chip 50 is mounted. In this example, the notification unit 113 of the wire bonding apparatus 10 displays the inspection results of the quality of wire bonding performed on each semiconductor chip 50 on the display unit 200 as "standard," "warning," and "abnormal" in descending order of quality of wire bonding.

Fourth Embodiment

Figure 10:
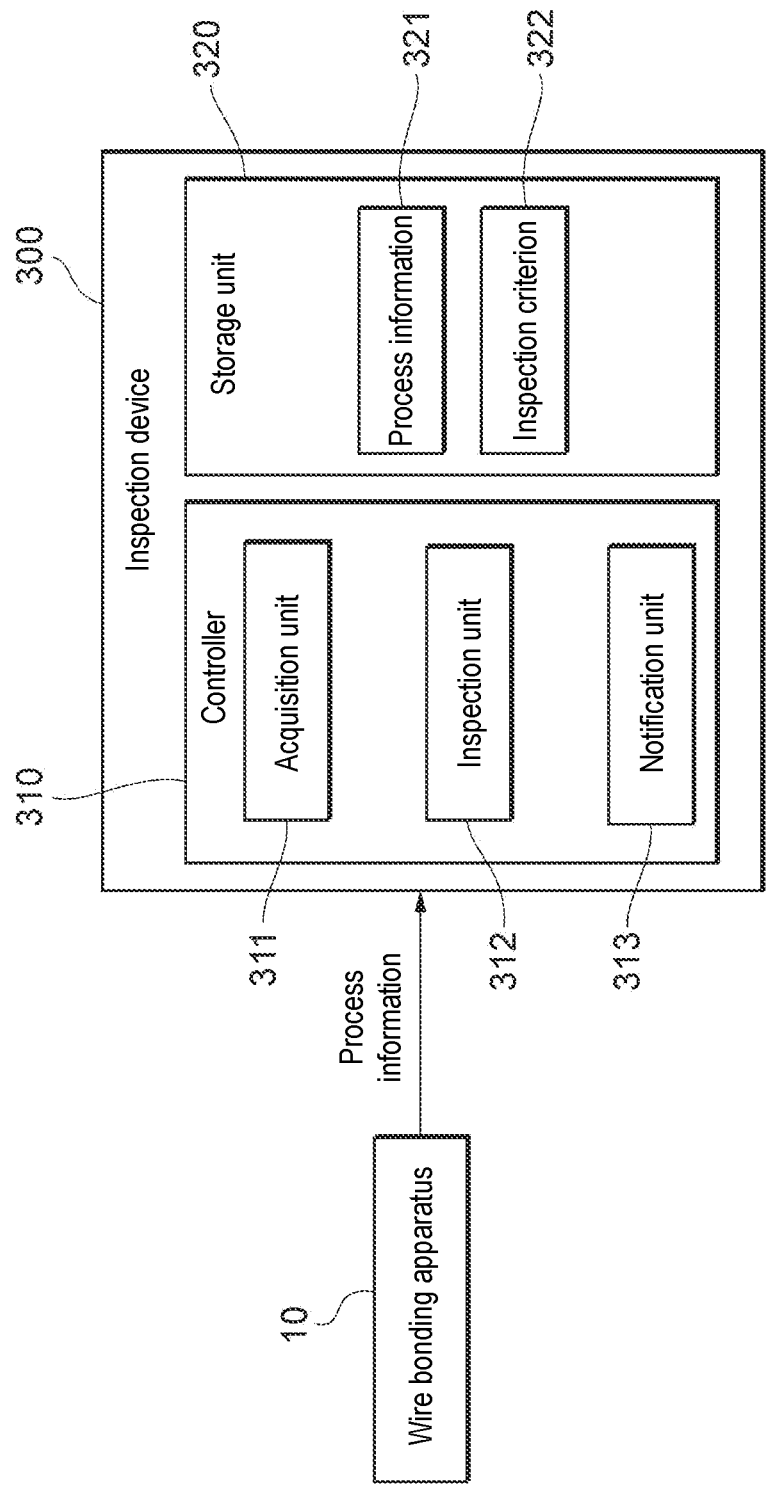
FIG. 10 is a diagram showing the configuration of the inspection device according to the fourth embodiment.

As shown in FIG. 10, an inspection device 300 according to the fourth embodiment includes, for example, a controller 310 and a storage unit 320.

The controller 310 is realized by, for example, a hardware processor such as a central processing unit (CPU) executing a program (software). In addition, some or all of the components may be realized by hardware (a circuit unit including circuitry) such as a large scale integration (LSI), an application specific integrated circuit (ASIC), a field-programmable gate array (FPGA), a graphics processing unit (GPU), and the like, or may be realized by the cooperation of software and hardware. The program may be stored in advance in a storage device such as an HDD or a flash memory of the inspection device 300, or may be stored in a removable storage medium such as a DVD or a CD-ROM, and may be installed in the HDD or flash memory of the inspection device 300 by mounting the storage medium to a drive device.

The storage unit 320 is a non-volatile storage medium, and is configured by, for example, a hard disk drive (HDD). The storage unit 320 stores various parameter values, functions, look-up tables, and the like used for control and calculation, in addition to a program for executing control and processing of the inspection device 300. Examples of parameter values used for control and calculation include process information 321 and an inspection criterion 322.

The controller 310 includes an acquisition unit 311, an inspection unit 312, and a notification unit 313, for example.

The acquisition unit 311 acquires information pertaining to the diameter of the pressure-bonded ball where the wire 60 is pressure-bonded to the terminal of the semiconductor chip 50 or the terminal of the substrate 51 by wire bonding from the wire bonding apparatus 10. For example, when the acquisition unit 311 acquires the information pertaining to the pressure-bonded ball diameter from the wire bonding apparatus 10 during wire bonding, the acquired information is stored in the storage unit 320 as the process information 321.

The inspection unit 312 inspects the quality of wire bonding based on the information pertaining to the pressure-bonded ball diameter read from the storage unit 320. For example, the inspection unit 312 inspects the quality of wire bonding by referring to the inspection criterion 322 stored in the storage unit 320, based on the information pertaining to the pressure-bonded ball diameter acquired by the acquisition unit 311. For example, the inspection unit 312 inspects the quality of wire bonding by comparing the information pertaining to the pressure-bonded ball diameter acquired by the acquisition unit 311 with the threshold value stored as the inspection criterion 322 in the storage unit 320.

The notification unit 313 notifies the inspection result of the quality of wire bonding when the inspection result of the quality of wire bonding from the inspection unit 312 does not satisfy the predetermined condition. For example, when the inspection unit 312 outputs an inspection result indicating that the quality of wire bonding is poor, the notification unit 313 notifies the inspection result of the quality of wire bonding from the inspection unit 312.

In addition, each of the above embodiments may be implemented in the following forms.

In the second embodiment, the inspection criterion 122 is not necessarily a numerical range that includes the pressing amount of the ball portion 61 specified based on the preset standard data of the pressure-bonded ball diameter, and may be, for example, a numerical range that includes the pressing amount of the ball portion 61 specified based on statistical data of the pressure-bonded ball diameter acquired by the acquisition unit 111. Besides, the inspection criterion 122 may be a numerical range higher than the pressing amount of the ball portion 61 specified as described above or a numerical range lower than the pressing amount of the ball portion 61 specified as described above. Moreover, the inspection criterion 122 is not necessarily a numerical range, and may be, for example, an upper limit value, a lower limit value, or a combination of the upper limit value and the lower limit value set based on the pressing amount of the ball portion 61 specified as described above.

In the second embodiment, the correlation data 123 is not necessarily data that indicates the correlation between the pressing amount of the ball portion 61 and the pressure-bonded ball diameter. For example, data that indicates the correlation between a spark voltage and the pressure-bonded ball diameter may be used as the correlation data 123 if the inspection unit 112 inspects the quality of wire bonding based on the spark voltage.

In the first to third embodiments, the functional block configuration included in the wire bonding apparatuses 10 and 10A may be configured as a wire bonding system distributed between the wire bonding apparatuses 10 and 10A and an external apparatus.

The wire bonding apparatus according to each of the above embodiments has been described above by exemplifying a case where the terminal of the semiconductor chip 50 and the terminal of the substrate 51 are electrically connected by the wire 60. Instead of this, for example, the wire bonding apparatus according to the above embodiment may be applied to a case where a semiconductor module is configured by electrically connecting the terminal of the semiconductor chip 50 and the terminal of a lead frame by the wire 60. Further, for example, the wire bonding apparatus according to the above embodiment may also be applied to a case where a bump is formed on any electrode such as the terminal of the semiconductor chip 50 by the wire 60.

What is claimed is:

1. A wire bonding system, comprising:
an acquisition unit that acquires information pertaining to a diameter of a pressure-bonded ball where a wire is pressure-bonded to an electronic component by wire bonding, wherein the information pertaining to the diameter of the pressure-bonded ball comprises a pressing amount of a ball portion at a tip of the wire against the electronic component during wire bonding;
a first storage unit that stores the information pertaining to the diameter of the pressure-bonded ball acquired by the acquisition unit;
an inspection unit that inspects quality of wire bonding based on the information pertaining to the diameter of the pressure-bonded ball read from the first storage unit;
a criterion setting unit that sets an inspection criterion for the information pertaining to the diameter of the pressure-bonded ball, and
a second storage unit that stores correlation data indicating a correlation between the pressing amount of the ball portion and the diameter of the pressure-bonded ball,
wherein the criterion setting unit sets a threshold value for the pressing amount of the ball portion as the inspection criterion by referring to the correlation data read from the second storage unit, based on preset standard data of the diameter of the pressure-bonded ball,
wherein the inspection unit inspects the quality of wire bonding by comparing the pressing amount of the ball portion acquired by the acquisition unit with the threshold value set by the criterion setting unit.

2. The wire bonding system according to claim 1, further comprising a notification unit that notifies an inspection result of the quality of wire bonding in response to the inspection result of the quality of wire bonding from the inspection unit not satisfying a predetermined condition.

3. The wire bonding system according to claim 2, wherein the notification unit notifies the inspection result of the quality of wire bonding from the inspection unit in association with information pertaining to a position of wire bonding in the electronic component.

4. The wire bonding system according to claim 1, wherein the criterion setting unit sets the inspection criterion for the information pertaining to the diameter of the pressure-bonded ball in response to an information amount of the information pertaining to the diameter of the pressure-bonded ball stored in the first storage unit being equal to or greater than a predetermined amount.

5. The wire bonding system according to claim 1, wherein the criterion setting unit specifies the pressing amount of the ball portion corresponding to the standard data by referring to the correlation data read from the second storage unit, based on the preset standard data of the diameter of the pressure-bonded ball, and sets a numerical range including the specified pressing amount of the ball portion as the inspection criterion, and
the inspection unit inspects the quality of wire bonding based on whether the pressing amount of the ball portion acquired by the acquisition unit is within the numerical range set as the inspection criterion.

6. An inspection device, comprising:
an acquisition unit that acquires information pertaining to a diameter of a pressure-bonded ball where a wire is pressure-bonded to an electronic component by wire bonding, wherein the information pertaining to the diameter of the pressure-bonded ball comprises a pressing amount of a ball portion at a tip of the wire against the electronic component during wire bonding;
a first storage unit that stores the information pertaining to the diameter of the pressure-bonded ball acquired by the acquisition unit;
an inspection unit that inspects quality of wire bonding based on the information pertaining to the diameter of the pressure-bonded ball read from the first storage unit;
a criterion setting unit that sets an inspection criterion for the information pertaining to the diameter of the pressure-bonded ball, and
a second storage unit that stores correlation data indicating a correlation between the pressing amount of the ball portion and the diameter of the pressure-bonded ball,
wherein the criterion setting unit sets a threshold value for the pressing amount of the ball portion as the inspection criterion by referring to the correlation data read from the second storage unit, based on preset standard data of the diameter of the pressure-bonded ball,
wherein the inspection unit inspects the quality of wire bonding by referring to the inspection criterion set by the criterion setting unit, based on the information pertaining to the diameter of the pressure-bonded ball acquired by the acquisition unit.

7. A wire bonding method, comprising:
acquiring information pertaining to a diameter of a pressure-bonded ball where a wire is pressure-bonded to an electronic component by wire bonding, wherein the information pertaining to the diameter of the pressure-bonded ball comprises a pressing amount of a ball portion at a tip of the wire against the electronic component during wire bonding;
storing the acquired information pertaining to the diameter of the pressure-bonded ball in a first storage unit;
inspecting quality of wire bonding based on the information pertaining to the diameter of the pressure-bonded ball read from the first storage unit;
setting an inspection criterion for the information pertaining to the diameter of the pressure-bonded ball, and
storing correlation data indicating a correlation between the pressing amount of the ball portion and the diameter of the pressure-bonded ball in a second storage unit,
wherein in the setting of the inspection criterion, setting a threshold value for the pressing amount of the ball portion as the inspection criterion by referring to the correlation data read from the second storage unit, based on preset standard data of the diameter of the pressure-bonded ball,
wherein the inspection unit inspects the quality of wire bonding by referring to the inspection criterion, based on the information pertaining to the diameter of the pressure-bonded ball.

8. A non-transient computer-readable recording medium, recording a program for one or more computers to execute:
acquiring information pertaining to a diameter of a pressure-bonded ball where a wire is pressure-bonded to an electronic component by wire bonding, wherein the information pertaining to the diameter of the pressure-bonded ball comprises a pressing amount of a ball portion at a tip of the wire against the electronic component during wire bonding;

storing the acquired information pertaining to the diameter of the pressure-bonded ball in a first storage unit;
inspecting quality of wire bonding based on the information pertaining to the diameter of the pressure-bonded ball read from the first storage unit;
setting an inspection criterion for the information pertaining to the diameter of the pressure-bonded ball, and
storing correlation data indicating a correlation between the pressing amount of the ball portion and the diameter of the pressure-bonded ball in a second storage unit,
wherein in the setting of the inspection criterion, setting a threshold value for the pressing amount of the ball portion as the inspection criterion by referring to the correlation data read from the second storage unit, based on preset standard data of the diameter of the pressure-bonded ball,
wherein the inspection unit inspects the quality of wire bonding by referring to the inspection criterion, based on the information pertaining to the diameter of the pressure-bonded ball.

* * * * *